(12) United States Patent
Liu et al.

(10) Patent No.: US 11,729,928 B2
(45) Date of Patent: Aug. 15, 2023

(54) TOWER UNINTERRUPTIBLE POWER SUPPLY FRAME AND A TOWER UNINTERRUPTIBLE POWER SUPPLY

(71) Applicant: SANTAK ELECTRONIC (SHENZHEN) CO., LTD., Shenzhen (CN)

(72) Inventors: Dan Liu, Shenzhen (CN); Dawei Zheng, Shenzhen (CN); Lei Cao, Shenzhen (CN); Lingfu Ou, Shenzhen (CN); Yunmei Wu, Shenzhen (CN)

(73) Assignee: SANTAK ELECTRONIC (SHENZHEN) CO., LTD., Shenzhen (CN)

(*) Notice: Subject to any disclaimer, the term of this patent is extended or adjusted under 35 U.S.C. 154(b) by 0 days.

(21) Appl. No.: 17/472,039

(22) Filed: Sep. 10, 2021

(65) Prior Publication Data
US 2022/0087041 A1   Mar. 17, 2022

(30) Foreign Application Priority Data

Sep. 10, 2020   (CN) .......................... 202021973780.5

(51) Int. Cl.
*H05K 5/02* (2006.01)
*H02J 9/06* (2006.01)

(52) U.S. Cl.
CPC ............ *H05K 5/0217* (2013.01); *H02J 9/062* (2013.01)

(58) Field of Classification Search
CPC ...... H05K 5/0217; H05K 7/1432; H02J 9/062
See application file for complete search history.

(56) References Cited

U.S. PATENT DOCUMENTS

2016/0316586 A1* 10/2016 Lai ....................... H05K 7/1432

* cited by examiner

*Primary Examiner* — Toan T Vu
(74) *Attorney, Agent, or Firm* — Stanek Lemon Crouse & Meek, P.A.

(57) ABSTRACT

The utility model provides a tower UPS frame and a tower UPS. The tower UPS frame comprises: a power supply module frame, which comprises two ports disposed oppositely; a power supply distribution frame; and a fan assembly, which comprises a fan frame and a fan fixed on the fan frame, wherein the power supply distribution frame and the fan frame are arranged in a same row as the power supply module frame and are detachably connected with the two ports of the power supply module frame. The tower UPS frame of the utility model is convenient in assembly and disassembly and reduces repair cost.

18 Claims, 7 Drawing Sheets

TOWER UNINTERRUPTIBLE POWER SUPPLY FRAME AND A TOWER UNINTERRUPTIBLE POWER SUPPLY

CROSS-REFERENCE TO RELATED APPLICATIONS

The present application claims priority to Chinese Patent Application No. 2020219737805; Filed Sep. 10, 2020, entitled A TOWER UNINTERRUPTIBLE POWER SUPPLY FRAME AND A TOWER UNINTERRUPTIBLE POWER SUPPLY.

TECHNICAL FIELD

The utility model relates to a UPS (uninterruptible power supply), and more particularly relates to a tower UPS frame and a tower UPS.

BACKGROUND ART

As important equipment for guaranteeing stable and continuous power supply, UPS s have been widely applied to various fields. Currently, the UPSs have been developed into various models in the market. As distinguished according to appearances and structures, the UPSs are classified into modularized UPS and tower UPS.

The tower UPS is separately placed on the ground or on a table through landing mounting, wherein a rectification unit and an inversion unit are designed according to stipulated powers. The tower UPS has a function of a maintenance bypass, and can convert a direct current output by a storage battery to an alternating current for continuous power supply in case of interruption of a mains supply.

However, an uninterruptible power module (UPM), a power distribution unit (PDU) and a fan in the existing tower UPS are fixed and installed in a frame shell, so that the UPM or PDU cannot be replaced or removed separately. In addition, as for the current tower UPS, it is impossible to remove and replace the UPM from the frame shell while making the PDU supply power to loads continuously. For this reason, use cost and maintenance cost of a user are increased.

SUMMARY OF THE INVENTION

Aiming at above technical problems existing in the prior art, the utility model provides a tower UPS frame which comprises:

a power supply module frame, which comprises two ports disposed oppositely;

a power supply distribution frame; and a fan assembly, which comprises a fan frame and a fan fixed on the fan frame;

wherein the power supply distribution frame and the fan frame are arranged in a same row as the power supply module frame and are detachably connected with the two ports of the power supply module frame.

Preferably, the tower UPS frame is cuboid-shaped; the power supply module frame defines cuboid-shaped storage space; the power supply distribution frame defines cuboid-shaped storage space; and the fan is located in the storage space defined by the power supply module frame.

Preferably, the power supply module frame comprises a first U-shaped side plate and a second U-shaped side plate disposed oppositely, wherein the first U-shaped side plate comprises a first bending part and a second bending part; the second U-shaped side plate comprises a third bending part and a fourth bending part; the first bending part and the third bending part are connected and located on a same plane; and the second bending part and the fourth bending part are connected and located on a same plane.

Preferably, the power supply module frame further comprises a top plate which covers the second bending part and the fourth bending part, wherein the top plate is fixedly connected with the second bending part and the fourth bending part.

Preferably, the power supply distribution frame comprises: a first ventilation plate and a second ventilation plate which are disposed oppositely; and a switch panel which is fixedly connected between the first ventilation plate and the second ventilation plate.

Preferably, the power supply distribution frame further comprises:

a first insulation baffle, which is parallel to the first ventilation plate and the second ventilation plate;

a second insulation baffle, which is perpendicular to the first ventilation plate and the second ventilation plate; and a third insulation baffle, which is perpendicular to the first ventilation plate and the second ventilation plate;

wherein the first, second and third insulation baffles are parallel to a wind direction of wind blown out by the fan.

Preferably, a plurality of fixation through holes are disposed in edges, close to the power supply module frame, of the first ventilation plate and the second ventilation plate; and the edges of the first ventilation plate and the second ventilation plate are detachably connected with one port of the power supply module frame by connectors.

Preferably, the fan frame is L-shaped and comprises an air inlet plate and a display panel, wherein the display panel is fixed on the edge of the air inlet plate and is perpendicular to the air inlet plate; and the fan is fixed on the inner side of the air inlet plate.

Preferably, the fan frame further comprises:

a first clamping plate, a second clamping plate and a third clamping plate fixed on the edge of the air inlet plate, wherein the first clamping plate is closely fitted with the edge of the first U-shaped side plate; the second clamping plate is closely fitted with the edge of the second U-shaped side plate; and the third clamping plate is closely fitted with the first bending part and the third bending part; and a fourth clamping plate and a fifth clamping plate which are fixed on the edge of the display panel, wherein the fourth clamping plate is closely fitted with the second bending part; and the fifth clamping plate is closely fitted with the fourth bending part.

Preferably, the tower UPS frame further comprises a first support fixed on the power supply distribution frame, and a second support fixed on the power supply module frame, wherein the first support and the second support are configured to be applicable to placement on a same plane.

The utility model further provides a tower UPS, which comprises:

a UPS module, which comprises a power supply module frame in, for example, the above tower UPS frame, and a circuit board fixed in the power supply module frame;

a power supply distribution unit which comprises a power supply distribution frame in, for example, the above tower UPS frame, and a plurality of switches and a terminal strip fixed in the power supply distribution frame; and a fan assembly in, for example, the above tower UPS frame.

Preferably, the circuit board comprises:

a bypass plate, which comprises a bypass interface;

an input-output interface plate, which comprises an input interface, an output interface and a battery interface; and a power plate which is electrically connected with the input-output interface plate;

wherein the bypass interface, the input interface, the output interface and the battery interface are close to one port of the power supply module frame, respectively.

Preferably, the terminal strip comprises a bypass input terminal, an AC input terminal, an AC output terminal and a battery connection terminal, wherein the battery connection terminal is configured to be electrically connected with the battery interface of the input-output interface plate; and the plurality of switches comprise:

a bypass switch, wherein one end thereof is electrically connected with the bypass input terminal, and the other end thereof is configured to be electrically connected with the bypass interface of the bypass plate;

an input switch, wherein one end thereof is electrically connected with the AC input terminal, and the other end thereof is configured to be electrically connected with the input interface of the input-output interface plate;

an output switch, wherein one end thereof is electrically connected with the AC output terminal, and the other end thereof is configured to be electrically connected with the output interface of the input-output interface plate; and a bypass maintenance switch, which is connected between the bypass input terminal and the AC output terminal.

The two opposite ends of the UPS module of the utility model are detachably connected with the power supply distribution unit and the fan assembly, so that assembly and disassembly are easy; and repair cost of users is reduced.

The power supply module frame is formed through assembly of the 2 U-shaped side plates, so that the structure is simple and assembly is convenient.

The ventilation plates of the power supply distribution frame facilitate emission and heat dissipation of hot air.

The insulation baffles of the power supply distribution frame enhance safety in replacement of the power supply distribution module.

The interfaces of the circuit board in the UPS module are located at one port of the power supply module frame, so that the UPS module can be applied to a modularized UPS and has good universal performance.

The tower UPS of the utility model can keep supplying power to loads during replacement of the UPS module.

BRIEF DESCRIPTION OF THE DRAWINGS

Embodiments of the utility model will be further described below with reference to the accompanying drawings. In the drawings.

DETAILED DESCRIPTION OF THE INVENTION

In order to make purposes, technical solutions and advantages of the utility model clearer, the utility model will be further described below in detail based on specific embodiments in conjunction with the accompanying drawings.

Figure 1:
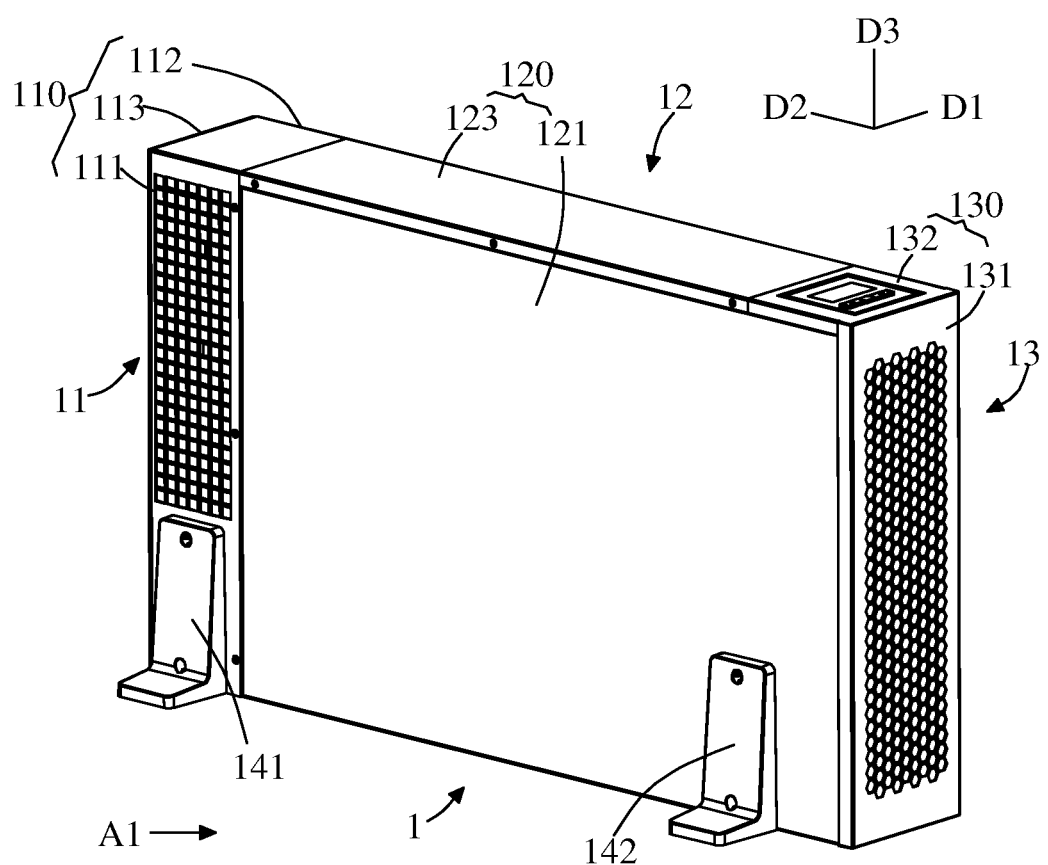
FIG. 1 is a 3D schematic diagram of a tower UPS according to a preferred embodiment of the utility model.

FIG. 1 is a 3D schematic diagram of a tower UPS according to a preferred embodiment of the utility model. As shown in FIG. 1, the tower UPS 1 comprises a power supply distribution unit 11, a UPS module 12 and a fan assembly 13 which are arranged in a row, and a first support 141 fixed on the power supply distribution unit 11 and a second support 142 fixed on the UPS module 12, wherein the power supply distribution unit 11 and the fan assembly 13 are detachably connected with two opposite ends of the UPS module 12.

Figure 7:
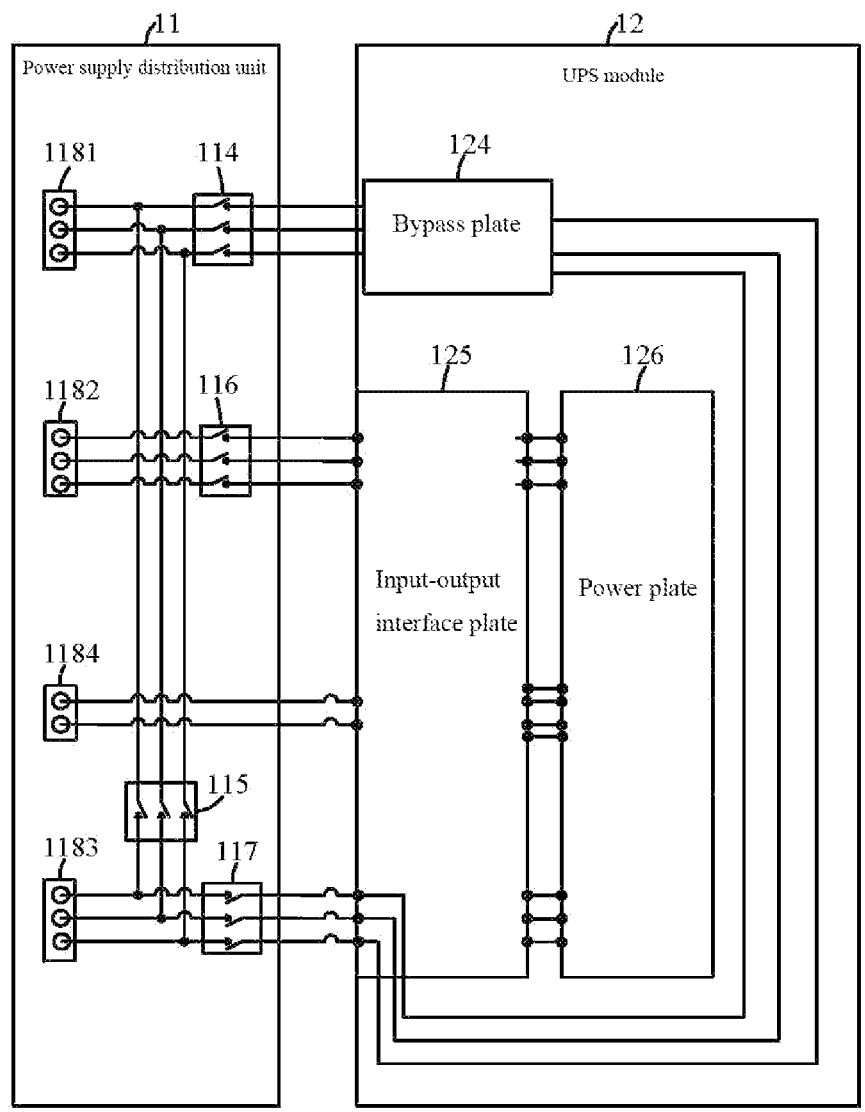
FIG. 7 is a block diagram of a circuit of the tower UPS shown in FIG. 1.

The UPS module 12 comprises a power supply module frame 120 which comprises two ports disposed oppositely and defines cuboid-shaped storage space; and a circuit board located in the storage space defined by the power supply module frame 120 (to be introduced in conjunction with FIG. 7). The power supply module frame 120 comprises a first U-shaped side plate 121 and a second U-shaped side plate (not shown in FIG. 1) which are disposed oppositely, and a top plate 123 which is fixedly connected with the first U-shaped side plate 121 and the second U-shaped side plate.

The power supply distribution unit 11 comprises a power supply distribution frame 110 which is roughly cuboid-shaped. The power supply distribution frame 110 comprises a first ventilation plate 111 and a second ventilation plate 112 (only one edge thereof is shown in FIG. 1) which are disposed oppositely; and a switch panel 113 which is fixedly connected between the first ventilation plate 111 and the second ventilation plate 112.

The fan assembly 13 comprises a fan frame 130 and the fan frame 130 comprises an air inlet plate 131 and a display panel 132, wherein the air inlet plate 131 is perpendicular to the first ventilation plate 111 and the second ventilation plate 112; and the display panel 132 is fixed on the edge of the air inlet plate 131 and perpendicular to the air inlet plate 131. The fan assembly 13 further comprises a fan fixed on the inner side of the air inlet plate 131 (not shown in FIG. 1). When the fan works, air on the outer side of the air inlet plate 131 is made to pass through the air inlet plate 131 and is then blown into the power supply module frame 120; and hot air inside the power supply module frame 120 is brought away and blown out from the power supply distribution frame 110.

The power supply distribution frame 110, the power supply module frame 120 and the fan frame 130 are arranged in a row; and the power supply distribution frame 110 and the power supply module frame 120 are detachably connected with two ports of the power supply module frame 120.

For convenience of later description, it is defined here that a direction pointed from the first ventilation plate 111 to the second ventilation plate 112 is a first direction D1; an arrangement direction of the fan assembly 13, the UPS module 12 and the power supply distribution unit 11 is a second direction D2; and a direction directed from a table face or a ground to the top plate 123 (or a height direction of the UPS module 12) is a third direction D3.

The tower UPS 1 is roughly cuboid-shaped and applicable to being placed on the ground or table face, wherein sizes of the air inlet plate 131, the display panel 132, the power supply module frame 120 and the power supply distribution frame 110 are equal in the first direction D1; and sizes of the air inlet plate 131, the power supply module frame 120 and the power supply distribution frame 110 are equal in the third direction D3. A first support 141 fixed on the power supply distribution frame 110 and a second support 142 fixed on the power supply module frame 120 further increase a contact area between the tower UPS 1 and the ground, so that the tower UPS can be stably placed on the ground or table face.

Figure 2:
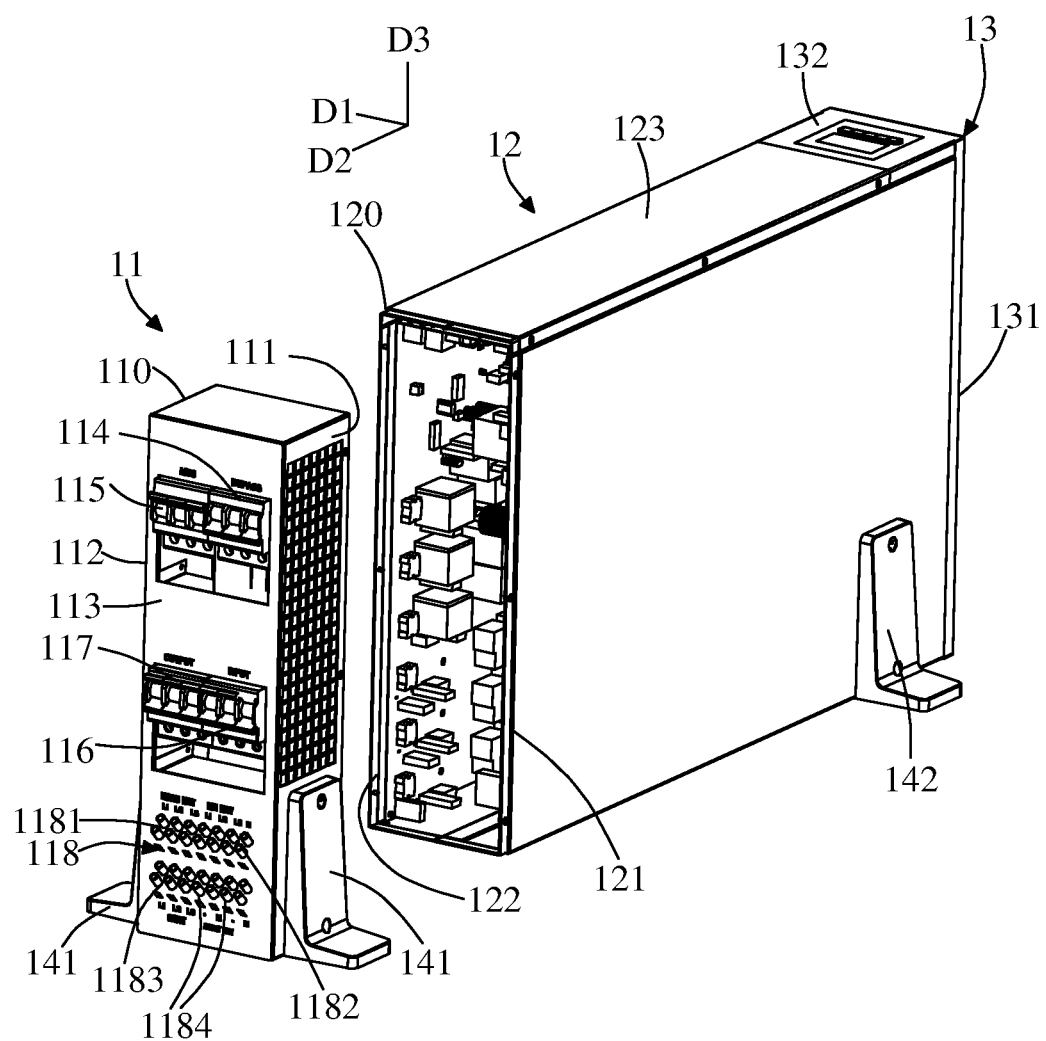
FIG. 2 is an exploded view of the tower UPS shown in FIG. 1, as viewed from a direction directed by an arrow A1.

FIG. 2 is an exploded view of the tower UPS shown in FIG. 1, as viewed from a direction directed by an arrow A1, namely a view sawn from the left side to the right side of FIG. 1. As shown in FIG. 2, the UPS module 12 further comprises a bypass plate, an input-output interface and a power plate located in the storage space defined by the power supply module frame 120 (as shown in FIG. 7), wherein electronic components in the bypass plate, the input-output interface plate and the power plate and connection relations thereof are public understood by those skilled in the art, so no introduction will be made here.

The power supply distribution unit 11 further comprises a bypass switch 114, a bypass maintenance switch 115, an input switch 116, an input switch 117 and a terminal strip 118 fixed in the power supply distribution frame 110. Operation handles of the bypass switch 114, the bypass maintenance switch 115, the input switch 116 and the output switch 117 pass through the switch panel 113 and extend out from the switch panel 113. The terminal strip 118 comprises a bypass input terminal 1181, an AC input terminal 1182, an AC output terminal 1183 and a battery connection terminal 1184. The bypass input terminal 1181, the AC input terminal 1182, the AC output terminal 1183 and the battery connection terminal 1184 partially pass through the switch panel 113 and extend out from the switch panel 113.

Figure 3:
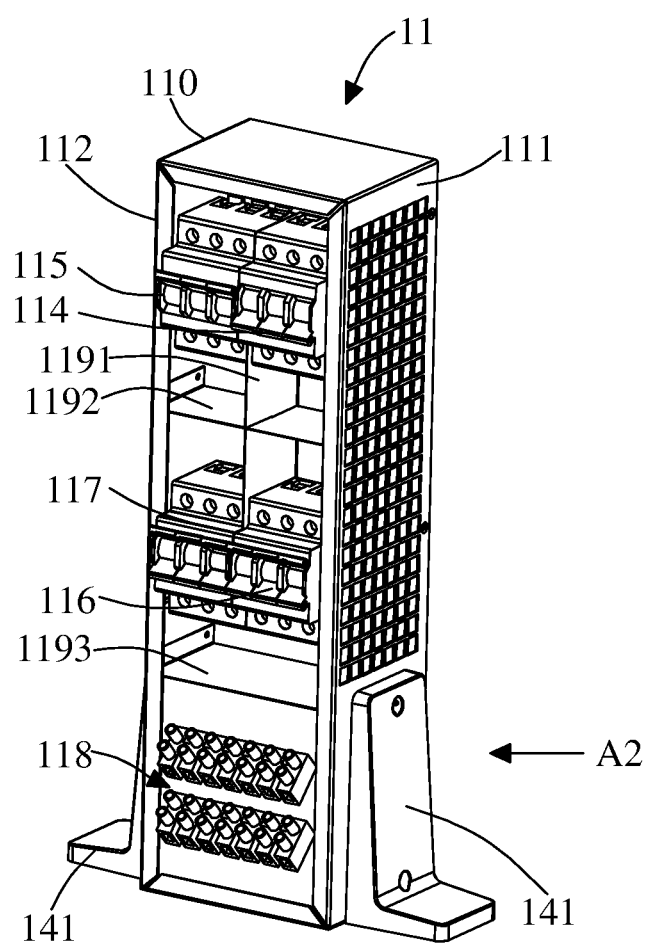
FIG. 3 is a 3D schematic diagram after a switch panel is removed from a power supply distribution unit shown in FIG. 2.

FIG. 3 is a 3D schematic diagram after the switch panel is removed from the power supply distribution unit shown in FIG. 2. As shown in FIG. 3, the power supply distribution unit 11 further comprises insulation baffles 1191, 1192 and 1193 located inside the power supply distribution frame 110. The insulation baffle 1191 is parallel to the ventilation plate 111 and a wind direction of wind blown out by the fan; one end of the insulation baffle 1191 is located between the bypass switch 114 and the bypass maintenance switch 115; and the other end thereof is located between the output switch 116 and the output switch 117. The insulation baffle 1192 is perpendicular to the ventilation plate 111 and parallel to the wind direction of the wind blown by the fan; and the insulation baffle 1192 is located between the adjacent bypass switch 114 and bypass maintenance switch 115 and between the adjacent input switch 116 and output switch 117. The insulation baffle 1193 is perpendicular to the ventilation plate 111 and parallel to the wind direction of the wind blown out by the fan and is located between the adjacent input switch 116, output switch 117 and terminal strip 118. In this way, the insulation baffle 1191, the insulation baffle 1192 and the insulation baffle 1193 mutually isolate the bypass switch 114, the bypass maintenance switch 115, the input switch 116 and output switch 117 and the terminal strip 118.

Figure 4:
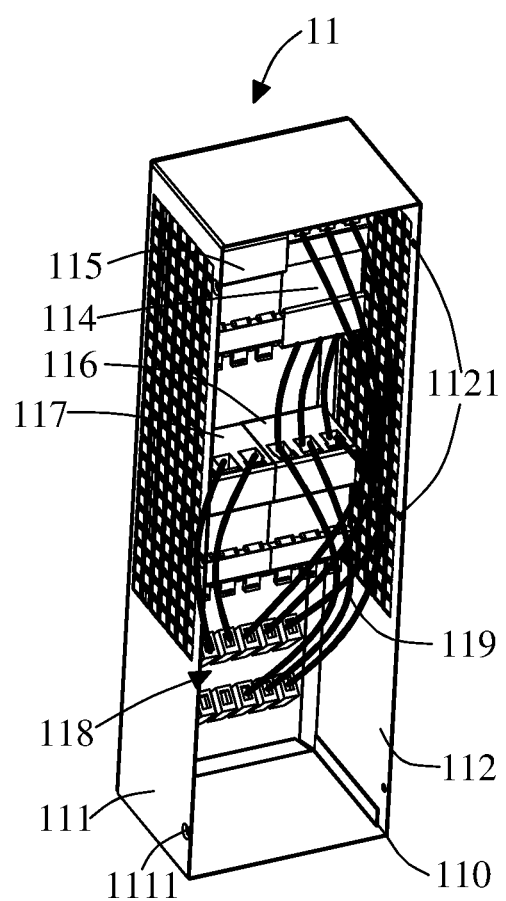
FIG. 4 is a 3D schematic diagram of the power supply distribution unit shown in FIG. 3, as viewed from a direction pointed by an arrow A2.

FIG. 4 is a 3D schematic diagram of the power supply distribution unit shown in FIG. 3, as viewed from a direction pointed by an arrow A2. FIG. 4 does not show the switch panel 113, the insulation baffles 1191, 1192 and 1193 and the L-shaped support 141. As shown in FIG. 4, a plurality of ventilation holes are formed in the ventilation plate 111; and a plurality of fixation through holes 1111 are formed in the edge close to the UPS module 12. Similarly, a plurality of ventilation holes are formed in the ventilation plate 112; and a plurality of fixation through holes 1121 are formed in the edge close to the UPS module 12.

The power supply distribution unit 11 further comprises wires 119 located inside the power supply distribution frame 110 (shown by a thick curve in FIG. 4). The wires 119 comprise a wire connected between the AC input terminal 1182 and one end of the input switch 117, a wire connected between the AC output terminal 1183 and one end of the output switch 116, a wire connected between the bypass input terminal 1181 and one end of the bypass maintenance switch 114, a wire connected between the bypass input terminal 1181 and one end of the bypass switch 115, and a wire connected between the other end of the bypass maintenance switch 114 and one end of the output switch 116.

Figure 5:
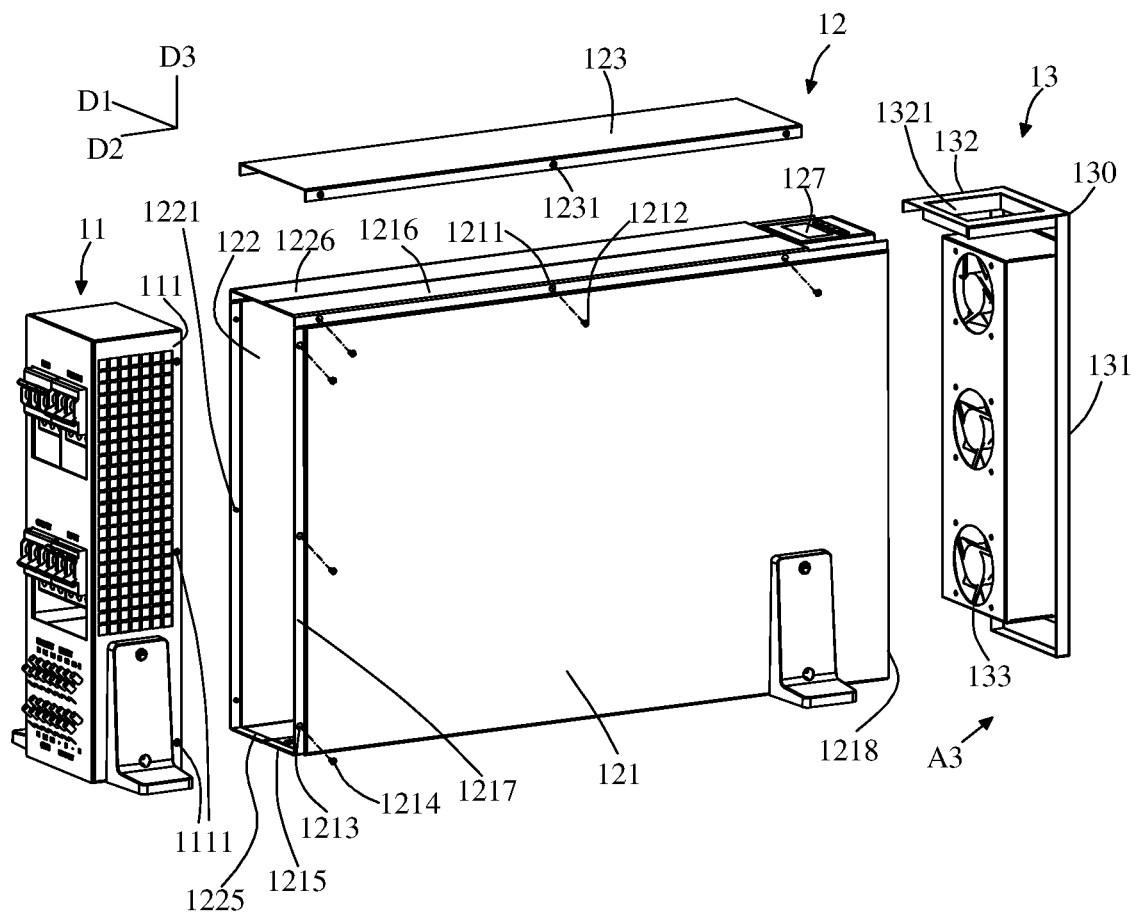
FIG. 5 is a further exploded view of the tower UPS shown in FIG. 2.

FIG. 5 is a further exploded view of the tower UPS shown in FIG. 2. As shown in FIG. 5, the first U-shaped side plate 121 and the second U-shaped side plate 122 are symmetrically arranged; the first U-shaped side plate 121 comprises a first bending part 1215 and a second bending part 1216 which are disposed oppositely; and the first bending part 1215 and the second bending part 1216 extend towards the second U-shaped side plate 122. Similarly, the second U-shaped side plate 122 comprises a third bending part 1225 and a fourth bending part 1226 which are disposed oppositely, wherein the third bending part 1225 and the first bending part 1215 are connected and located on a same plane; and the second bending part 1216 and the fourth bending part 1226 are connected and located on a same plane.

A plurality of fixation through holes 1211 are formed in the second bending part 1216; and similarly, a plurality of fixation through holes are formed in the fourth bending part 1226 (not shown in FIG. 5). A plurality of fixation through holes 1231 corresponding to the plurality of fixation through holes 1211 in the second bending part 1216 are formed in one side of the top plate 123; and a plurality of fixation through holes corresponding to the plurality of fixation through holes in the fourth bending part 1226 are formed in the other side (not shown in FIG. 5). When the top plate 123 covers the second bending part 1216 and the fourth bending part 1226, connectors such as screws 1212 and bolts successively pass through the fixation through holes 1231 in the top plate 123 and the fixation through holes 1211 in the second bending part 1216, so that fixed connection of the top plate 12 and the first U-shaped side plate 121 is realized. Similarly, by the connectors such as the screws or bolts, the other side of the top plate 123 and the second U-shaped side plate 122 are fixedly connected. In this way, the top plate 123 makes relative positions of the first U-shaped side plate 121 and the second U-shaped side plate 122 unchanged.

The first U-shaped side plate 121 further comprises a first edge 1217 fitted with the power supply distribution frame 110 and a second edge 1218 fitted with the fan frame 130, wherein a plurality of fixation through holes 1213 are formed in the first edge 1217; and the plurality of fixation through holes 1213 are corresponding to the plurality of fixation through holes 1111 in the edge of the first ventilation plate 111 respectively. Similarly, a plurality of fixation through holes 1221 are formed in the edge of the second U-shaped side plate 122; and the plurality of fixation through holes 1221 are corresponding to the plurality of fixation through holes 1121 in the second ventilation plate 112 (as shown in FIG. 4). When the UPS module 12 is embedded or inserted into the power supply distribution unit 11, the edges of the first U-shaped side plate 121 and the second U-shaped side plate 122 coincide with the edges of the first ventilation plate 111 and the second ventilation plate 112 respectively; and through connectors such as screws 1214 or screw rods, the UPS module 12 and the power supply distribution unit 11 can be assembled together.

The UPS module 12 further comprises an operation display screen 127; and the operation display screen 127, the second bending part 1216 and the fourth bending part 1226 are located on a same plane. The operation display screen 127 can display running situations of the tower UPS 1 and control operation modes thereof.

The fan frame 130 is L-shaped, wherein the display panel 132 is fixed on the edge of the air inlet plate 131 and extends towards the top plate 123; and a storage through hole 1321 fitted with the shape of the operation display screen 127 is formed in the display panel 132 and used for storing the operation display screen 127. A fan 133 is fixed on the inner side wall of the air inlet plate 131 and used for making air on the outer side of the air inlet plate 131 pass through the air inlet plate 131 and be blown into the power supply module frame 120.

Figure 6:
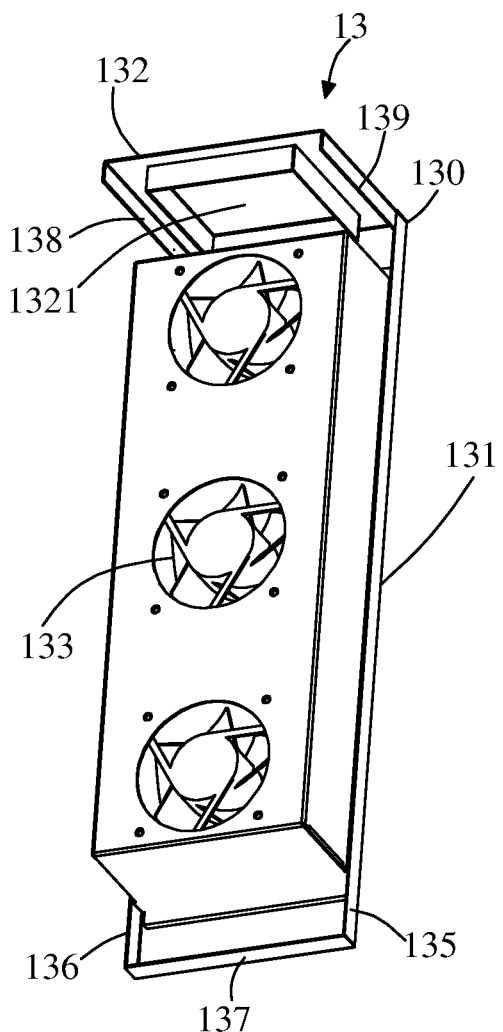
FIG. 6 is a 3D schematic diagram of a fan assembly shown in FIG. 5, as viewed from a direction pointed by an arrow A3.

FIG. 6 is a 3D schematic diagram of the fan assembly shown in FIG. 5, as viewed from a direction pointed by an arrow A3. As shown in FIG. 6, the fan frame 130 further comprises clamping plates 135, 136 and 137 fixed on the edge of the air inlet plate 131, and a clamping plate 138 and a clamping plate 139 fixed on the edge of the display panel 132. The clamping plate 135 and the clamping plate 136 are parallel and disposed oppositely; and an interval of both is equal to the width of the power supply module frame 120 (namely the size along the first direction DD. The display panel 132 and the clamping plate 137 are parallel and disposed oppositely; and an interval of both is equal to the height of the power supply module frame 120 (namely the size along the third direction D3). The clamping plate 138 and the clamping plate 139 are parallel and disposed oppositely; and an interval of both is equal to the width of the power supply module frame 120. When the fan assembly 13 and the UPS module 12 are assembled together, the clamping plates 135 and 136 are closely fitted with second edges of the first U-shaped side plate 121 and the second U-shaped side plate 122 respectively; the clamping plates 137 and 138 are closely fitted with the second bending part 1216 and the fourth bending part 1226 respectively; and the clamping plate 137 is closely fitted with the first bending part 1215 and the third bending part 1225. In this way, the fan frame 130 is closely clamped at the port of the power supply module frame 120.

Next, with reference to FIG. 2 and FIG. 5 again, an assembly process of the tower UPS 1 is described. Two opposite sides of the top plate 123 are fixedly connected to the second bending part 1216 and the fourth bending part 1226 respectively; the fan assembly 13 is embedded or inserted into the port of the power supply module frame 120 along the second direction D2, so that the fan 133 is located in the storage space defined by the power supply module frame 120, and the clamping plates 135-139 are closely fitted with the port of the power supply module frame 120; and then the power supply distribution unit 11 is embedded or inserted into the other port of the power supply module frame 120 along a direction opposite to the second direction D2, so that the edges of the first ventilation plate 111 and the second ventilation plate 112 of the power supply distribution unit 11 coincide with the first edge 1217 of the first U-shaped side plate 121 and the first edge of the second U-shaped side plate 122 respectively; and finally, the screws are used to realize fixed connection of the power supply distribution frame 110 and the power supply module frame 120.

The UPS module 12 in the tower UPS 1 is connected with the power supply distribution unit 11 and the fan assembly 13 in a dismountable manner. When any of the components fails, the component can be dismounted for repair and replacement, so that a user's repair cost is reduced.

The power supply distribution unit 11, the UPS module 12 and the fan assembly 13 are arranged in a row; and the power supply distribution unit 11 and the UPS module 12 are cuboid-shaped, so that the tower UPS 1 is regular in shape, applicable to placement on the ground or table face, and convenient for assembly and disassembly.

The power supply module frame 120 comprises the first U-shaped side plate 121 and the second U-shaped side plate 122 which are disposed oppositely, so that the power supply module frame 120 is simple in structure and convenient in assembly.

The top plate 123 covers the second bending part 1216 and the fourth bending part 1226 and is fixedly connected therewith, so that the first U-shaped side plate 121 and the second U-shaped side plate 122 are firmly fixed, and changes in relative positions of both are avoided.

The first ventilation plate 111 and the second ventilation plate 112 of the power supply distribution frame 110 are connected with the edges of the first U-shaped side plate 121 and the second U-shaped side plate 122 by the connectors respectively, and extra fixation and connection devices are not needed, so that assembly and disassembly are convenient.

Because of the first ventilation plate 111 and the second ventilation plate 112, a channel for air circulation is formed between the fan frame 130, the power supply module frame 120 and the power supply distribution frame 110; the fan assembly 13 sucks the air from the outer side of the air inlet plate 131 into the UPS module 12; and finally, the air is blown out from the first ventilation plate 111 and the second ventilation plate 112, so that emission and heat dissipation of the hot air are easy.

The insulation baffles 1191, 1192 and 1193 are parallel to the air circulation direction and will not hinder circulation of the hot air, so that the hot air in the UPS module 12 can be easily blown out from the power supply distribution unit 11.

The fan frame 130 is of a simple structure and does not occupy extra space after being assembled with the power supply module frame 120, so that the tower UPS 1 is of a compact structure and occupies small space.

The clamping plates 135-139 of the fan frame 130 can be closely clamped with the port of the power supply module frame 120, so that extra connectors are not needed and assembly and disassembly are convenient.

FIG. 7 is a block diagram of a circuit of the tower UPS shown in FIG. 1. As shown in FIG. 7, the circuit board in the UPS module 12 comprises the input-output interface plate 125 which comprises an input interface, an output interface and a battery interface; the power plate 126 which is electrically connected with the input-output interface plate 125; and the bypass plate 124 with a bypass interface, which is electrically connected to the output interface of the input-output interface 125. The other end of the bypass switch 114 is configured to be connected to the bypass interface of the bypass plate 124 by a bypass wire or a quick connector; the other end of the input switch 116 is configured to be connected to the input interface of the input-output interface plate 125 by an input wire or a quick connector; the output switch 117 is configured to be connected to the output interface of the input-output interface plate 125 by an output wire or a quick connector; and the battery connection terminal 1184 is configured to be connected to the battery interface of the input-output interface plate 125 by a battery wire or a quick connector.

Before use, an AC power supply (eg. three-phase AC) is connected to the AC input terminal 1182; another standby AC power supply (eg. AC generated by an electric generator) is connected to the bypass input terminal 1181; a rechargeable battery is connected to the battery connection terminal 1184; and the AC output terminal 1183 is connected to a load.

When the tower UPS 1 works normally, the bypass switch 114 is conducted, and the bypass maintenance switch 115 is switched off; and the input switch 116 is conducted and the output switch 117 is conducted. The power plate 126 in the UPS module 12 outputs the AC to the AC output terminal 1183 by the input-output interface plate 125 and the output switch 117.

When the tower UPS 1 fails and needs to be repaired, the user needs to operate the operation display screen 127 on the UPS module 12, so that the bypass plate 124 in the UPS module 12 is conducted. In this way, the standby AC power supply supplies power to the load by the conducted bypass switch 114, the conducted bypass plate 124 and the conducted output switch 117. At this time, if the UPS module 12 needs to be replaced, the following operation steps are needed in succession:

Step S1: the bypass maintenance switch 115 is conducted. At this time, the standby AC directly supplies power to the load connected at the AC output terminal 1183 by the conducted bypass maintenance switch 115; and the input switch 116, the output switch 117 and the bypass switch 114 are switched off.

Step S2: the fan frame 130 and the power supply module frame 120 are separated; and the screws on the first ventilation plate 111 and the second ventilation plate 112 of the power supply distribution frame 110 are dismounted, so that the power supply distribution frame 110 and the power supply module frame 120 are separated.

Step S3: connection wires between the input switch 116, the output switch 117 and the bypass switch 114 and the UPS module 12 are disconnected, so that connection between the UPS module 12 and the power supply distribution unit 11 on the circuit is disconnected.

Step S4: a new UPS module is replaced and assembled together with the power supply distribution unit 11; the fan assembly 13 is installed on the new UPS module; the input switch 116, the output switch 117 and the bypass switch 114 are conducted; and by the display screen 127 on the operation display panel, the tower UPS 1 is switched to a bypass state, so that the tower UPS 1 supplies power to the load by both the pass and the maintenance pass. The bypass maintenance switch 115 is switched off; and by the display screen 127 on the operation display panel, the tower UPS 1 is switched from the bypass state to an online dual-conversion state.

The bypass maintenance switch 115 is disposed in the power supply distribution unit 11. During replacement of the UPS module 12, the standby AC power supply can continuously supply power to the load of the AC output terminal 1183 by the conducted bypass maintenance switch 115, so that the UPS module 12 is replaced while continuous power supply is realized.

In the above step S3, the insulation baffles 1191, 1192 and 1193 in the power supply distribution unit 11 can, to some extent, limit the bypass wire connected on the bypass switch 114, the input wire connected on the input switch 116, the battery wire connected on the battery connection terminal 1184 and the output wire connected on the output switch 117, so that the wires are prevented from passing the switch panel 113 and then extending to outside of the power supply distribution frame 110; the user is prevented from touching upper parts of the electrified terminal strip 118, the bypass maintenance switch 115 and the output switch 117 and suffering possible electric shock hazards after touching the wires by accident.

The bypass interface of the bypass plate 124, the input interface and the output interface of the input-output interface plate 125 and the battery interface are close to one port of the power supply module frame 120, so that the port of the UPS module 12 can be directly inserted in the modularized UPS.

In other embodiments of the utility model, dismountable connection is realized between the two ports, which are disposed oppositely, of the UPS module 12 and the power supply distribution unit 11 and the fan assembly 13 through buckle connection or pluggable connection.

The power supply module frame 120 is not limited to being constituted by the two U-shaped side plates which are disposed oppositely. In another embodiment of the utility model, the power supply module frame is assembled by four side plates; and the adjacent two side plates are perpendicular to limit the cuboid storage space.

In a yet another embodiment of the utility model, the top plate 123 may be fixedly connected with the first U-shaped side plate 121 and the second U-shaped side plate 122 through modes such as welding and adhesion.

The utility model is described by the preferred embodiments, but the utility model is not limited to the embodiments described here and may include various changes and alterations made without departing from the scope of the utility model.

The invention claimed is:

1. A tower uninterruptible power supply (UPS) frame, comprising:
a cuboid power supply module frame having rectangular first and second ports on opposite first and second sides thereof;
a detachable power supply distribution frame configured to cover the first port of the power supply module frame; and
a detachable fan assembly comprising a fan frame configured to cover the second port of the power supply module frame and a fan supported by the fan frame.

2. The tower UPS frame according to claim 1, the fan is configured to extend into a storage space defined by the power supply module frame when the fan frame is attached to the power supply module frame.

3. The tower UPS frame according to claim 2, wherein the power supply module frame comprises a first U-shaped side plate and a second U-shaped side plate disposed oppositely; the first U-shaped side plate comprises a first bending part and a second bending part; the second U-shaped side plate comprises a third bending part and a fourth bending part; the first bending part and the third bending part are connected and located on a same plane; and the second bending part and the fourth bending part are connected and located on a same plane.

4. The tower UPS frame according to claim 3, wherein the power supply module frame further comprises a top plate which covers the second bending part and the fourth bending part, and the top plate is fixedly connected with the second bending part and the fourth bending part.

5. The tower UPS frame according to claim 2, wherein the power supply distribution frame comprises:
- a first ventilation plate and a second ventilation plate disposed on opposite sides of the power supply distribution frame; and
- a switch panel fixedly connected to the power supply distribution frame between the first ventilation plate and the second ventilation plate.

6. The tower UPS frame according to claim 5, wherein the power supply distribution frame further comprises:
- a first insulation baffle parallel to the first ventilation plate and the second ventilation plate;
- a second insulation baffle perpendicular to the first ventilation plate and the second ventilation plate; and
- a third insulation baffle perpendicular to the first ventilation plate and the second ventilation plate,
- wherein the first, second and third insulation baffles are parallel to a wind direction of wind blown out by the fan.

7. The tower UPS frame according to claim 5, wherein a plurality of fixation through holes are disposed in edges, close to the power supply module frame, of the first ventilation plate and the second ventilation plate; and the edges of the first ventilation plate and the second ventilation plate are detachably connected with one port of the power supply module frame by connectors.

8. The tower UPS frame according to claim 3, wherein the fan frame is L-shaped and comprises an air inlet plate and a display panel; the display panel is fixed on an edge of the air inlet plate and is perpendicular to the air inlet plate; and the fan is fixed on an inner side of the air inlet plate.

9. The tower UPS frame according to claim 8, wherein the fan frame further comprises:
- a first clamping plate, a second clamping plate and a third clamping plate fixed on the edge of the air inlet plate, wherein the first clamping plate is closely fitted with the edge of the first U-shaped side plate; the second clamping plate is closely fitted with the edge of the second U-shaped side plate; and the third clamping plate is closely fitted with the first bending part and the third bending part; and
- a fourth clamping plate and a fifth clamping plate fixed on the edge of the display panel, wherein the fourth clamping plate is closely fitted with the second bending part; and the fifth clamping plate is closely fitted with the fourth bending part.

10. The tower UPS frame according to claim 1, wherein the tower UPS frame further comprises a first support fixed on the power supply distribution frame, and a second support fixed on the power supply module frame, wherein the first support and the second support are configured to be applicable to placement on a same plane.

11. A tower UPS, comprising the tower UPS frame of claim 1 and further comprising:
- a UPS module comprising a circuit board fixed in the power supply module frame; and
- a power supply distribution unit comprising a plurality of switches and at least one terminal fixed in the power supply distribution frame.

12. The tower UPS according to claim 11, wherein the circuit board comprises:
- a bypass plate comprising a bypass interface;
- an input-output interface plate comprising an input interface, an output interface and a battery interface; and
- a power plate electrically connected with the input-output interface plate,
- wherein the bypass interface, the input interface, the output interface and the battery interface are close to one port of the power supply module frame, respectively.

13. The tower UPS according to claim 12, wherein the at least one terminal comprises a bypass input terminal, an AC input terminal, an AC output terminal and a battery connection terminal; the battery connection terminal is configured to be electrically connected with the battery interface of the input-output interface plate; and the plurality of switches comprise:
- a bypass switch, wherein one end thereof is electrically connected with the bypass input terminal, and the other end thereof is configured to be electrically connected with the bypass interface of the bypass plate;
- an input switch, wherein one end thereof is electrically connected with the AC input terminal, and the other end thereof is configured to be electrically connected with the input interface of the input-output interface plate;
- an output switch, wherein one end thereof is electrically connected with the AC output terminal, and the other end thereof is configured to be electrically connected with the output interface of the input-output interface plate; and
- a bypass maintenance switch connected between the bypass input terminal and the AC output terminal.

14. A UPS comprising:
- a power supply module comprising at least one circuit board housed in a cuboid power supply module frame having a rectangular first port and a rectangular second port on opposite first and second sides of the power supply module frame;
- a detachable power supply distribution unit comprising at least one switch configured to be coupled to the power supply module and housed in a power distribution unit frame configured to cover the first port of the power supply module frame; and
- a detachable fan assembly comprising at least one fan housed in a fan assembly frame configured to cover the second port of the power supply module frame.

15. The UPS of claim 14, wherein the power supply distribution unit comprises:
- a first AC terminal configured to be connected to an AC power supply and to the power supply module;
- a second AC terminal configured to be connected a load and to the power supply module; and
- a switch operable to connect the first AC terminal to the second AC terminal.

16. The UPS of claim 15, wherein the switch comprises a first switch and wherein the power supply distribution unit further comprises:
- a second switch operable to connect and disconnect the first AC terminal to and from the power supply module; and
- a third switch operable to connect and disconnect the second AC terminal to and from the power supply module.

17. The UPS of claim 15, wherein the power supply distribution unit further comprises a DC terminal configured to be connected to the power supply module and to an external battery.

18. The UPS of claim 14, wherein the power supply distribution frame comprises at least one vent configured to pass air to or from at least one ventilation channel between the fan assembly and the power supply distribution frame and through the power supply module.

\* \* \* \* \*